United States Patent [19]

Arnold

[11] Patent Number: 4,738,025
[45] Date of Patent: Apr. 19, 1988

[54] AUTOMATED APPARATUS AND METHOD FOR POSITIONING MULTICONTACT COMPONENT

[75] Inventor: Aaron L. Arnold, Jupiter, Fla.

[73] Assignee: Northern Telecom Limited, Montreal, Canada

[21] Appl. No.: 945,563

[22] Filed: Dec. 23, 1986

[51] Int. Cl.$^4$ .................... H05K 3/30; B23P 19/00
[52] U.S. Cl. ................................. 29/834; 29/740; 29/833; 901/9; 901/47
[58] Field of Search ............... 29/833, 834, 407, 740; 901/9, 47

[56] References Cited

U.S. PATENT DOCUMENTS

| | | | |
|---|---|---|---|
| 4,342,090 | 7/1982 | Caccoma et al. | 29/834 X |
| 4,598,456 | 7/1986 | McConnell | 29/833 X |
| 4,663,658 | 5/1987 | Lanne et al. | 901/47 X |
| 4,675,993 | 6/1987 | Harada | 29/740 |

OTHER PUBLICATIONS

IBM Tech. Discl. Bull, vol. 27, No. 6, Nov. 1984, pp. 3653-3655, by M. S. Chester et al.

Primary Examiner—Timothy V. Eley
Assistant Examiner—Carl J. Arbes
Attorney, Agent, or Firm—Schwartz, Jeffery, Schwaab, Mack, Blumenthal & Evans

[57] ABSTRACT

Automated positioning apparatus for positioning multicontact components on a circuit board utilizes automated members having a high degree of repetitive movement but not in themselves accurate, such member being relatively inexpensive. A positioning member picks up a component and moves it over a first viewing head. The component is viewed and its orientation determined. A viewing head on the positioning member is then positioned over a target on a circuit board and its position and orientation determined. The results enable the positioning member to position the component on the circuit board in the correct position and orientation. The viewing heads are calibrated for aspect ratio and pixel dimension. Also, the field of view of the viewing heads are calibrated for orientation relative to the positioning member. The position and orientation of the viewing head on the positioning member relative to a pick-up member on the positioning member is also obtained.

20 Claims, 7 Drawing Sheets

AUTOMATED APPARATUS AND METHOD FOR POSITIONING MULTICONTACT COMPONENT

BACKGROUND OF THE INVENTION

1. Field of the Invention

This invention relates to an automated positioning system, as used for placement of integrated circuit devices or components on circuit boards. In particular, the invention relates to the calibration of the apparatus for the system, both at an initial set up and on the change of component, and for other purposes.

2. Related Art

Electronic devices or components are mounted on circuit boards both by the insertion of leads through holes in the circuit board, the holes associated with solder pads, and by surface mounting in which contact leads are positioned on solder pads on the circuit board. In both arrangements, the leads are soldered to the circuit pattern on the board, via the solder pads. As the number of leads per component increases, particularly the increase in the number of leads extending from large scale integrated circuit devices, surface mounting is becoming more widespread. In addition to the increase in the number of leads there is also occurring a reduction in pitch of the leads. From early pitches of 0.1 inches, with the leads being approximately 0.05 inches, pitches of 0.025 inches are now being used with leads of about 0.008 inches. Such leads are very fragile and mounting by insertion of leads into holes is not possible.

As many as 256 leads can be provided on a component, usually positioned around four sides of a packaged component. Contact or solder pads can be formed at a satisfactory degree of accuracy, but consistently positioning a component so that all leads align with pads is very difficult.

Automated positioning machines are widely used for positioning components having less difficult Positioning requirements. Such machines have a high degree of accuracy in repetitive movement. The positioning head can return to a desired position very accurately. However, the components to be positioned are not accurately and consistently positioned at a supply station. This can cause a first element of mispositioning of a component on a circuit board. Because of manufacturing tolerances of circuit boards, circuit boards are not accurately positioned at a loading position. This causes a second element of mispositioning of a component. Inaccuracies in positioning of a component on a circuit board can be along an X axis and/or a Y axis and also relative rotational inaccuracy.

SUMMARY OF THE INVENTION

To accurately position a component on a circuit board it is necessary to inspect or view each component on pick up by the placement head to provide actual coordinate positioning of the component and to view the circuit board to ascertain its actual positional coordinates. As two separate viewing cameras or systems are used, one to view the component, the other to view the circuit board, it is necessary to calibrate each camera and obtain the resolution of each camera. It is also necessary to obtain the relative position of the pick-up or placement head relative to the X and Y coordinates of the camera which views the component. These calibrations are necessary on first setting up a placement apparatus, when cameras are removed and replaced and if maintenance is done on the placement head.

It is also necessary to determine the position of the placement head relative to the viewing position which views the component. As the camera which views the circuit board is offset relative to the placement head, it is also necessary to determine the position of the circuit board viewing camera relative to the placement head. These two calibrations need to be repeated on change of a component placement position, change of placement head, change of circuit board viewing camera, and other occurrences.

BRIEF DESCRIPTION OF THE DRAWINGS

The invention will be readily understood by the following description, in conjunction with the accompanying drawings, in which.

DETAILED DESCRIPTION OF THE EMBODIMENTS

Figure 1:
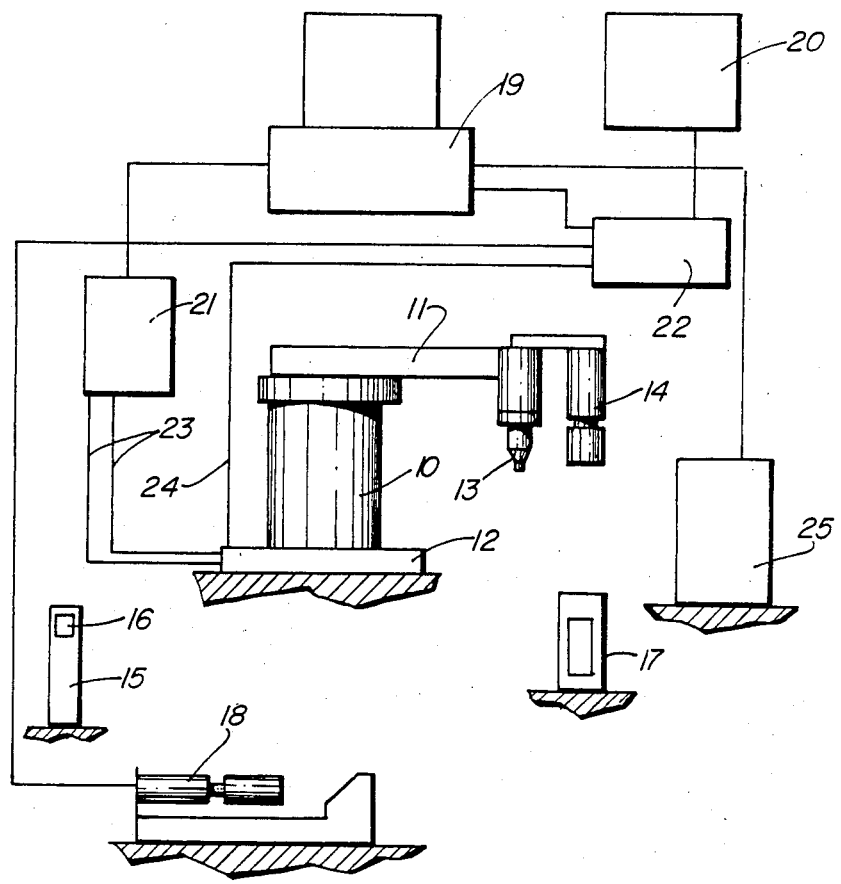
FIG. 1 is a diagrammatic layout of a particular arrangement for positioning a component on a circuit board.

FIG. 1 is a diagrammatic representation of a component placement system. A programmable apparatus 10, often referred to as a robot, in the example has a moving arm 11, the arm capable of movement about the vertical axis of the machine, giving X, Y movement relative to the machine base 12. The arm carries a placement tool 13 and a camera 14, referred to as the arm mounted camera. Components are supplied at a storage position 15 having a pick-up position 16. A mounting position 17 has provision for holding a circuit board onto which a component, or components, will be mounted. An inspection camera is positioned at 18, in the example the camera viewing via a right angle prism. A host computer 19 is provided, a vision monitor 20, a robot or placement machine controller 21, and a vision computer 22. The various computers, controller and monitor are interconnected as shown in FIG. 1. In the example, connections between the placement machine 10 and its controller 21 are indicated at 23, providing movement of the arm about a vertical axis, extension and retraction of the arm, rotation of the placement tool 13 about a vertical axis, and actuation of the placement tool to pick up, and release, a component. Connection 24 connects the arm mounted camera 14 to the vision computer 22. A control or operator panel 25 is also provided.

As stated previously, at an initial set-up, it is necessary to calibrate the cameras, 14 and 18. Three calibrations are carried out on the inspection camera 18, diagrammatically illustrated in FIG. 2. These are aspect ratio, pixel dimension and angular relationship between parallel planes, of the camera and placement tool coordinates. This angular relationship, illustrated in FIG. 3, is required for conversion of angles between coordinate systems. A calibration tool is illustrated in FIG. 4.

Figure 2:
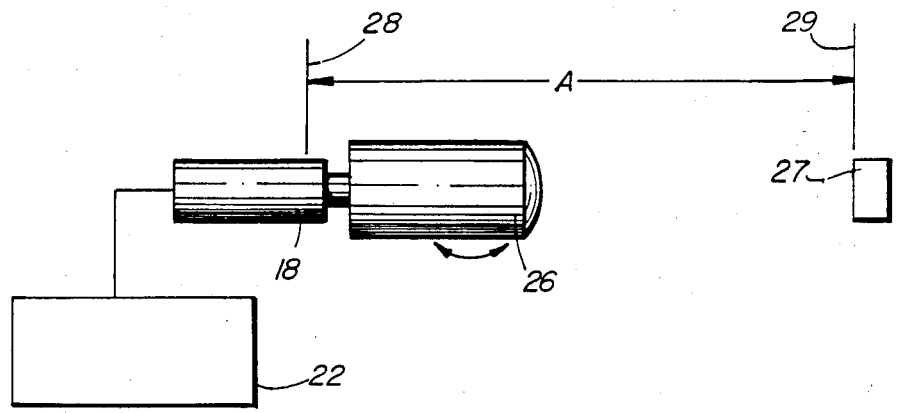
FIG. 2 is a diagrammatic representation of one of the cameras in FIG. 1, identified as an inspection camera.
Figure 3:
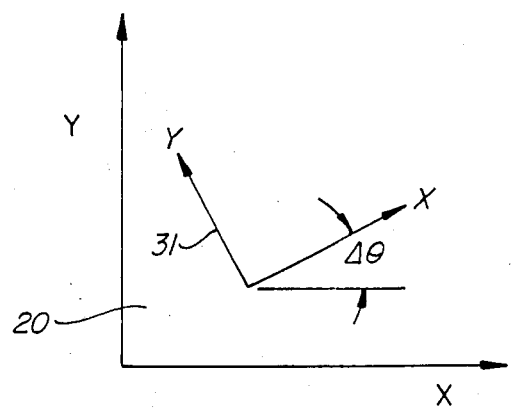
FIG. 3 illustrates an example of angular coordinates between the camera as in FIG. 2 and the placement head or tool.

In FIG. 2, the camera 18, with its lens 26, is shown relative to an object 27. The object 27 is the component to be viewed by the camera system. The distance between the image plane 28 and the object plane 29 is a calibrated distance A for correct measurement. In FIG. 3, the coordinate frame for the placement tool is indicated at 30, while a representative coordinate frame for the camera 18 is indicated at 31. It should be appreciated that the angular relationship between coordinate frames 30 and 31 will vary on initial assembly of the system.

Figure 4:
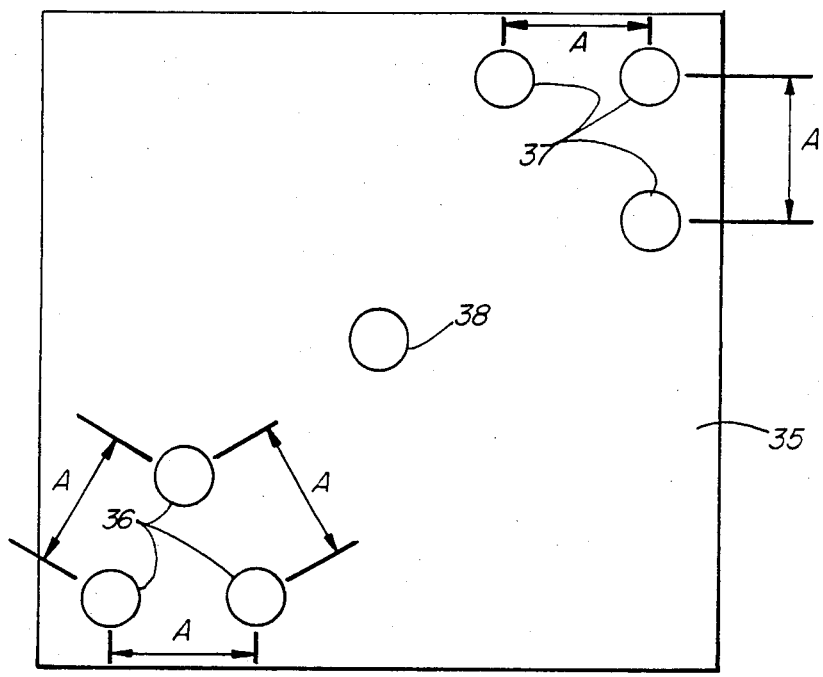
FIG. 4 illustrates a calibration tool.

The tool illustrated in FIG. 4 comprises a flat plate 35 with seven targets arranged in three groups, circles 36 in the form of an equilateral triangle, circles 37 in the form of an isosceles triangle and a single circle 38. The targets, represented by the circles, may be holes or pins. If pins are used, the focus point is the pin tips. If holes are used, the focus point is the surface of the plate 35. The isosceles triangle targets 37 are used for aspect ratio calculation, and the equilateral triangle targets 36 for pixel dimension calibration. The term "Pixel dimension" refers to the effective dimensions on the object over which each pixel measures light intensity. This is required for the objects size in pixels to be scaled to real world quantities. The center target 38 is used to determine the angle between the inspection camera 18 coordinates and the placement tool 13 coordinates. The dimension A in FIG. 4 should preferably be selected so that at the desired resolution the equilateral triangle formed by the targets 36 will fill the monitor screen with each target 36 fully visible. The diameter of the targets is preferably approximately 40% of the dimension A.

The aspect ratio of the camera's pixels must be calibrated before calibrating pixel size. To calibrate the aspect ratio, the object's final distance relative to the camera is estimated and the front surface of the tool, plate 35, is placed there-if the targets are holes. The tip surfaces of the pins, if used as targets, is otherwise positioned thus. The isosceles triangle, targets 37, should be in the view of the camera 18. The camera system then locates the targets and the aspect ratio calculated.

Figure 5:
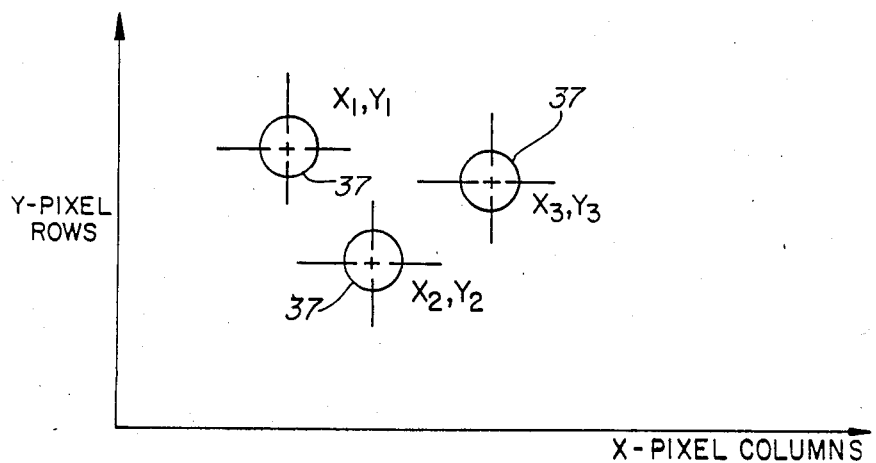
FIGS. 5, 6 and 7 illustrate the use of the tool in FIG. 4 for aspect ratio calculation, pixel dimension calculation and calculation of the angular relationship between the camera of FIG. 2 and placement tool coordinates respectively, and for aspect ratio and pixel dimension calculation for the arm mounted camera.

The aspect ratio is calculated as follows:

$$\text{Aspect Ratio } (AR) = \frac{\text{pixel length}}{\text{pixel width}}$$

$$\text{if } Y_3 - Y_2 = 0, AR = \frac{X_3 - X_2}{Y_1 - Y_2}$$

$$\text{if } Y_1 - Y_2 = 0, AR = \frac{X_2 - X_1}{Y_3 - Y_2}$$

in any other circumstance, $$AR = \frac{X_3 - X_2}{Y_1 - Y_2} = \frac{X_2 - X_1}{Y_3 - Y_2}$$

where X and Y are the coordinates as illustrated in FIG. 5. The aspect ratio is used as a scale factor when calculating distances from the pixel coordinates, such as is done to calibrate pixel dimensions.

Figure 6:
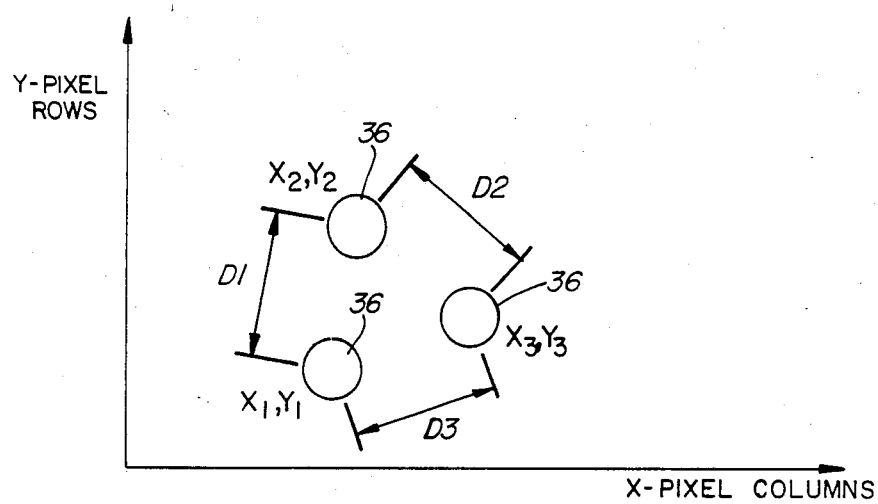

Pixel dimension calibration is performed by measuring the distances between the targets 36 of the equilateral triangle and comparing the average distance to the desired distance if the proper resolution were obtained. The front surface of the tool, plate 35, is positioned as for the aspect ratio calibration, but with the targets 36 in the view of the camera 18. This is illustrated in FIG. 6. The desired distance in pixels between targets is calculated by the ratio of the actual distance, A in FIG. 4, to the desired resolution. The average distance between targets is used to average out errors and ensure that some measurements are made at an angle related to the inspection camera frame.

Calculation of the distances in pixel coordinates is as follows:

$$D1 = \sqrt{(Y_2 - Y_1)^2 + ((X_2 - X_1) \times AR)^2}$$

$$D2 = \sqrt{(Y_3 - Y_2)^2 + ((X_3 - X_2) \times AR)^2}$$

$$D3 = \sqrt{(Y_3 - Y_1)^2 + ((X_3 - X_1) \times AR)^2}$$

$$\text{Average distance (pixels)} = \frac{D1 + D2 + D3}{3}$$

$$\text{Current resolution} = \frac{A \text{ (from FIG. 4)}}{\text{Average distance}}$$

If the calculated average distance is less than the desired distance, then the distance between the tool and the camera should be decreased. If the calculated average distance is greater than the desired distance, the distance between the tool and the camera is increased. While changing the distance between tool and camera, the camera lens must be refocussed.

Knowledge of whether the distance between the tool and camera should be increased or decreased allows a placement tool to be servoed to the proper viewing distance automatically. When the position for correct resolution has been found, it is recorded so that it may be repeated. Measurements by the inspection camera system will only be valid at the calibrated distance from the camera.

Figure 7:
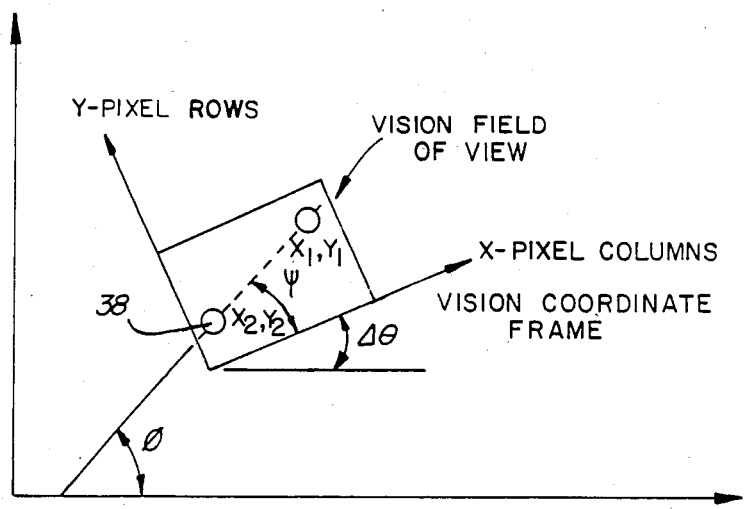

Determining the angle between the placement tool coordinates and the inspection camera coordinates requires the placement tool be moved over the inspection camera field of view. Only the center target 38 is in the field of view. The placement tool moves the target to one side of the field of view. The inspection camera system finds the target, by scanning of the field of view, and determines its position coordinates. The placement tool then moves the target along a known angle in the placement tool's coordinate system so that the target 38 is on the other side of the field of view. This is illustrated in FIG. 7. The inspection camera system then finds this second position and calculates the angle from the first position to the second position. This angle is then compared to the known angle moved by the placement tool. The difference between these two angles is used as an offset to angles calculated by the inspection camera system to determine angles relative to the placement tools coordinate system. This calibration is only rated between parallel planes of the coordinate systems. The calculation of this calibration is as follows:

$$\psi = \operatorname{Tan}^{-1}\left[\frac{Y_1 - Y_2}{(X_1 - X_2) \times AR}\right]$$

$\phi$ = known angle moved by manipulator $$\Delta\theta = \phi - \psi$$

$\phi$ = known angle moved by manipulator
$\Delta\theta = \phi - \psi$

The tool 35 is picked up and positioned, and moved, by the placement tool, which conveniently has a vacuum pick-up and holding facility.

The above described calibration process uses a distance measuring method of calibrating camera resolution, as compared with other resolution calibrations using area measurement. The area method is subject to edge noise where edge pixels of the calibration tool may randomly change value, which changes the area measured. The distance method uses the centroids of the targets. The edges of the targets are subject to the same noise as in the area method but the centroid change is minimal. Further, the average distance between three targets is used to further reduce any edge noise effects. Having three sets of targets on one calibration tool reduces handling.

The arm mounted camera 14 is calibrated for pixel dimension and for resolution using the tool 35, or a similar tool. Thus, as an example, the tool 35, which for the calibration of the inspection camera 18 has been positioned with the targets facing downward, is turned over and placed at the mounting position 17. The tool sits in a pocket at the mounting position. The above described calibration sequences for pixel dimension and aspect ratio are repeated with the arm mounted camera. The resolution may be different—in a particular automated positioning process as described later, a different resolution is required. This is because the inspection camera will be viewing lead ends, while the arm mounted camera will be viewing a relatively larger target area on a circuit board.

The above calibrations are carried out on initial set up and after any replacement, maintenance and the like of any of the major parts, for example, placement tool, inspection camera, and arm mounted camera. It is independent of component and circuit board as long as the viewing planes are constant, that is, as long as the distance from the object plane to the view plane is constant.

A further calibration required at initial set up is to determine the placement tool position relative to the field of view of the inspection camera system. This calibration is carried out to determine the placement tool's position relative to the inspection camera systems coordinates when the placement tool is out of the field of view of the camera. Also, such calibration is required if the inspection camera is replaced, or removed for maintenance, for example. The calibration is carried out by attaching an arm of known dimensions to the placement tool, finding two targets on the arm by the inspection camera, and calculating the positional coordinates between placement tool and inspection camera.

Figure 8:
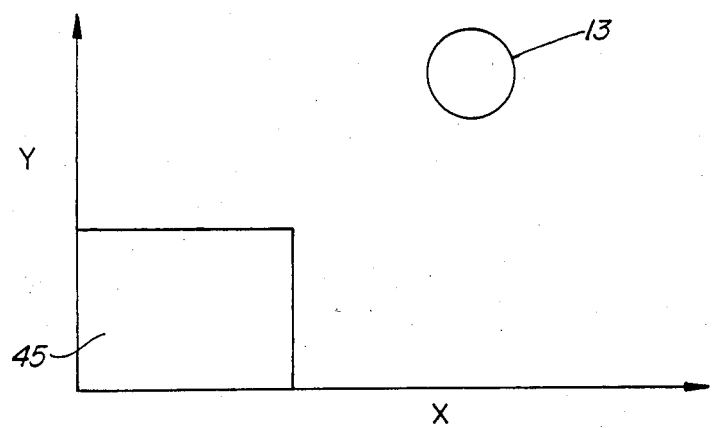
FIG. 8 illustrates the relative positions of the placement head or tool and the field of view of the inspection camera.
Figure 9:
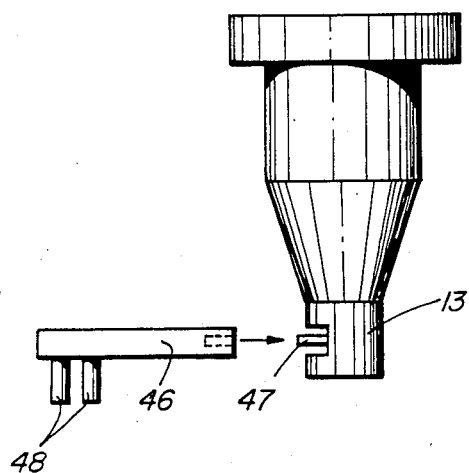
FIGS. 9 and 10 illustrate a calibration lever and targets as used for calibrating the placement tool and inspection camera.
Figure 10:
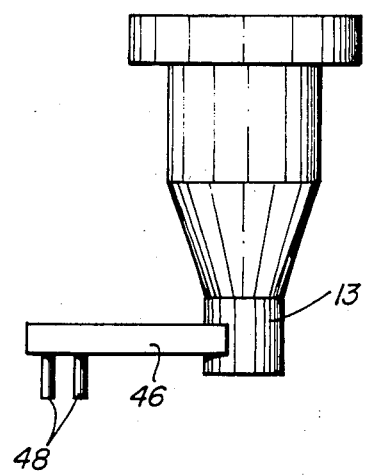
Figure 11:
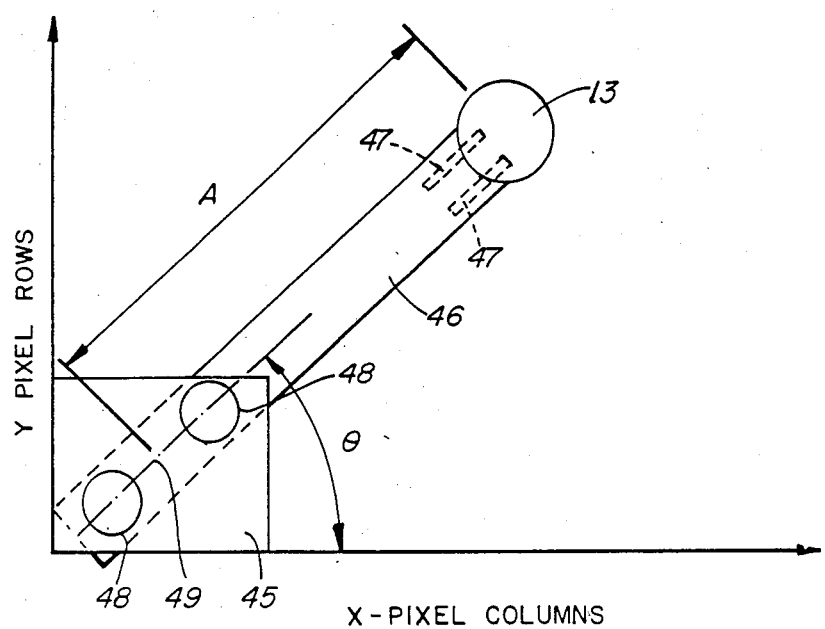
FIG. 11 illustrates diagrammatically the orientation calibration of the placemet tool relative to the inspection camera.

FIGS. 8 to 11 illustrate one arrangement for determining the relative positions of placement tool 13 and inspection camera 18. FIG. 8 illustrates diagrammatically the situation with the placement tool shown at 13, and the inspection camera field of view indicated by rectangle 45, the X and Y axes also being indicated. Calibration is performed by attaching lever 46, of known dimensions, to the placement tool 13. Lever 46 is located accurately by dowels 47 for repeatability. Two target pins 48 extend normal to the axis of the lever 46. Lever 46 and tool 13 are shown in FIG. 9 and the assembly is shown in FIG. 10. The distances of the axes of the pins 48 from the axis of the tool 13 is accurately known. The diameter of each pin, for optimum results, is about 40% of the distance between the axes of the pins 48. The positioning of the target pins 48 is also such that they are seen in their entirety approaching opposite sides of the viewing field. This is seen in FIG. 11 where the pins 48 are close to the edges of the field of view 45 but are fully visible. The distances along the X and Y axes or coordinates to the edges of the field of view are measured in pixels, as is conventional in scanning for CCD cameras. The host computer 14, from the X and Y signals and knowing the dimensions of the lever 46, determines the center point 49 and the angle $\theta$, to thereby calculate the X, Y center of the tool 13. Once this described calibration is carried out, the exact positional relationship between placement tool 13 and the inspection camera 18 is determined and retained in the host computer 19.

Figure 12:
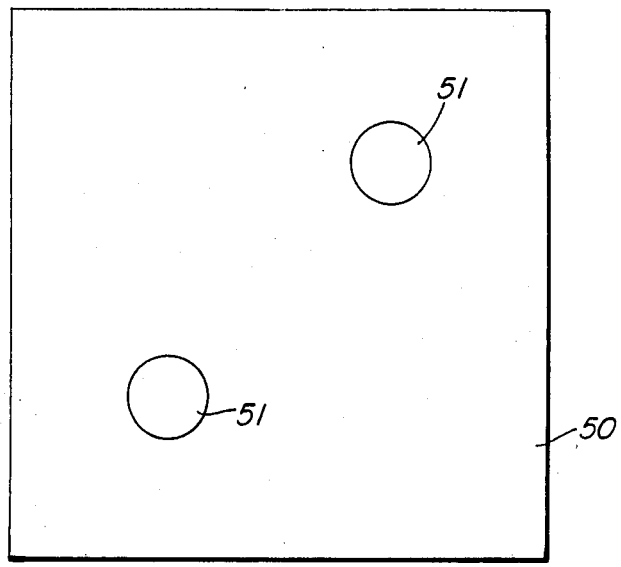
FIG. 12 is a plan view of a calibration tool used to obtain datum correlation between the placement position and placement tool.
Figure 13:
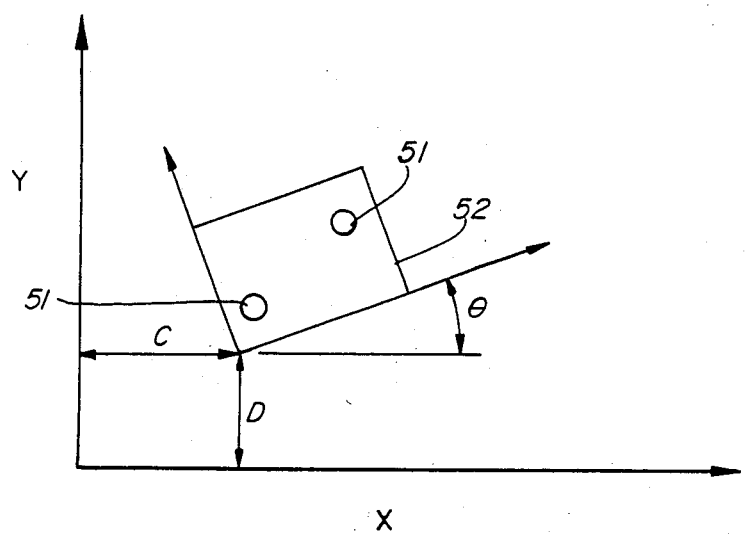
FIG. 13 illustrates the orientation calibration of the placement tool relative to the placement position.

A further calibration is to set up a mathematical transformation for the placement position on a board. As the placement tool 13 picks up and carries the component to be placed, it is not possible to have direct viewing at the placement tool so the viewing is done by the arm mounted camera 14. Before commencing the placement of components, correlation between placement tool 13 and camera 14 is obtained. A calibration member 50 having two targets 51 as in FIG. 12 is positioned at the mounting position 17. The placement tool 13 is first positioned over the calibration member 50. In the example there is an optical fiber bundle in the placement tool which both illuminates and views the calibration member. The host computer 19 steps the placement tool 13 to scan the calibration member, to determine the centerpoint of each target 51. By scanning the calibration member the position of the two targets is determined in relation to the coordinates of the positioning machine 10, and placement tool 13, for example the coordinates X and Y in FIG. 13. The targets are made highly visible by forming black holes in a matte white member, or white marks on a matte black surface.

After the placement tool has scanned the calibration member, the arm mounted camera 14 is moved over and again the calibration member is scanned, this time by camera 14. There will be produced information relating the position of the targets 51, relative to the camera 14 field of view indicated by the rectangle 52. Thus a positioned relationship of the targets relative to coordinates of the camera 14 field of view is obtained. This information also permits the host computer 19 to derive a positional relationship of the field of view at the arm mounted camera 14 relative to the placement tool 13. This can be exemplified by distances C and D and angle $\theta$ in FIG. 13.

Circuit boards on which components are to be mounted have two targets produced, at each mounting position, at the time contact pads are defined. The targets on the circuit board have the same center to center distance relationship as the targets 51 on the calibration member 50.

Thus the various parts or sections of the system are capable of inspecting or viewing a component picked up by the placement tool, determining its positional orientation relative to a datum center line on the placement tool, determing the positional orientation of this mounting position of the component on a circuit board, and moving the placement tool such that the component is correctly orientated relative to the mounting position on the circuit board.

Reverting back to FIG. 1, on initiation of a cycle, as by pressing a button on the control panel 25, the host computer 19, via the controller 21, sends the necessary signal for the arm to move and position the placement tool 13 over the pick-up position 16. Vacuum is applied to the placement tool and a component picked up. The arm moves and positions the component over the inspection camera 18. Camera 18 views the underside of the component. The position of components at the pick-up position is such that on initial positioning of the component over inspection camera 18, a corner of the component is located by the camera, with at least one lead on each side of the viewed corner in the field of view. The view, as seen by the inspection camera is reproduced on the monitor 20. A light shines up onto the bottom surface of the component and the ends of the leads appear as white spots. The view seen by the camera is scanned in the conventional manner, the picture being split up into elements, referred to as "pixels". The host computer issues commands to cause movement of the arm 11 so that the entire component is moved stepwise over the inspection camera. Each frame is scanned and the vision computer 22 detects the white spots. The vision computer is able to determine the presence of all leads and their relative positions. Floating datums are determined based on the X, Y positions of all leads. Each lead is then measured relative to the datums to determine if any leads are missing or misaligned. This information can also be given on the monitor. This viewing of the component also provides information as to the orientation and position of the component relative to the placement tool 13. Thus the host computer 19 has available information as to the variation in orientation and position of the component relative to the placement tool center.

When inspection is complete, the host computer causes the arm to be moved so that the arm mounted camera 14 is positioned over the position on the circuit board at which the component is to be placed. At this position there will be a plurality of solder contact pads arranged to align with the leads on the component. When the positions of the contact pads are being defined on the board, the locating markers or targets previously described are also defined in the position. The arm mounted camera forms a picture composed of pixels, as at the inspection position. The pixels are scanned and the coordinates of the locating markers or targets in the board determined, using the calibration information. These coordinates are used to position the placement tool so as to correctly position the component.

Any variations in the positions of components in the tubes in which they are provided, and any positional variations in circuit boards, are detected, measured, and corrected as the component is placed in position.

While various embodiments of the invention have been described, it will be understood that it is capable of further modification, and this application is intended to cover any variations, uses, or adaptations of the invention, following in general principles of the invention and including such departures from the present disclosure as to come within knowledge or customary practice in the art to which the invention pertains, and as may be applied to the essential features hereinbefore set forth and falling within the scope of the invention or the limits of the appended claims.

What is claimed is:

1. A method of positioning a multi-contact component on a circuit board, comprising:
   picking up a component by a movable positioning member;
   moving said component over a first viewing means for orientation determination of the component;
   determining component lead alignment by moving the positioning member to scan the entire component across the first viewing means;
   moving said positioning member to position a second viewing means mounted on said movable member to view a target on said circuit board for orientation determination of the target;
   moving said positioning member to position said component over said board, said component being positioned and oriented relative to said target from said orientation determination by said first and second viewing means; and
   placing said component on said board.

2. The method as claimed in claim 1, including calibrating said first viewing head.

3. The method as claimed in claim 1, including calibrating said second viewing head.

4. The method as claimed in claim 1, including calibrating a placement tool on said positioning member relative to the field of view of said second viewing means.

5. The method as claimed in claim 1, including calibrating the orientation of a placement tool on said positioning member relative to the orientation of said second viewing means.

6. A method of positioning a multi-contact component on a circuit board, comprising:
   picking up a component by a movable positioning member;
   moving said component over a first viewing means for orientation determination of the component;
   moving said positioning member to position a second viewing means mounted on said movable member to view a target on said circuit board for orientation determination of the target;
   moving said positioning member to position said component over said board, said component being positioned and oriented relative to said target from said orientation determination by said first and second viewing means; and
   placing said components on said board; and
   calibrating said first viewing means for aspect ratio, pixel dimension and angular relationship, between parallel planes, of the coordinates of the first viewing means and the positioning member.

7. The method as claimed in claim 6, including calibrating said second viewing means for pixel dimensions and aspect ratio.

8. The method as claimed in claim 7, including calibrating the position of a placement tool on said positioning means relative to the field of view of the second viewing means, and calibrating the orientation of the placement tool and the second viewing means.

9. The method as claimed in claim 6, said calibration for aspect ratio being obtained by viewing three targets positioned as an isosceles triangle, and determining the distances between the targets and calculating the aspect ratio from said distances.

10. The method as claimed in claim 9, said calibration for pixel dimension being obtained by viewing three targets positioned as an equilateral triangle, determining the distance between the targets and comparing the average of said distances with a desired distance, and adjusting the viewing means to produce an average distance equal to the desired distance.

11. The method as claimed in claim 10, said calibration of said angular relationship being obtained by viewing a target at a first position at one side of the field of view of said first viewing means, detecting the position of said target, moving the target by a placement tool on said positioning member along a known angle to a second position at the other side of the field of view of said first viewing means, detecting the new position of said target, calculating the angle from the first position to the second position and comparing the obtained angle to the known angle.

12. The method as claimed in claim 7, said calibration of said second viewing means for pixel dimensions being obtained by viewing three targets positioned as an equilateral triangle, determining the distances between the targets and comparing the average of said distances with a desired distance, and adjusting the second viewing means to produce an average distance equal to the desired distance.

13. A method as claimed in claim 7, the calibration for aspect ratio being obtained by viewing three targets positioned as an isosceles triangle, determining the distances between the targets and calculating the aspect ratio from said distances.

14. The method as claimed in claim 8, the calibrating of the position of the placement tool relative to the field of view of the second viewing means obtained by mounting two targets on said tool, each target a known, different, distance from the axis of the tool, positioning the targets adjacent to the field of view perimeter, measuring the coordinates along X and Y axes of the centers of said targets, determining a center point between said targets and the angle subtended by said targets, and calculating the position of the axis of the tool relative to the field of view.

15. The method as claimed in claim 8, the calibration of orientation of the placement tool relative to the second viewing means being obtained by positioning two targets at a mounting position for said component on a board; viewing the targets through a viewing means on the axis of the placement tool to determine the axis of each target and determining the position of the targets relative to the coordinates of the positioning machine and placement tool, viewing the two targets by said second viewing means and obtaining the position of the targets relative to the field of view of the second viewing means, and then deriving a positional relationship of the field of view relative to the placement tool.

16. Apparatus for positioning a multi-contact component on a circuit board, comprising:
 a movable positioning member;
 pick-up means on said positioning member for picking up and carrying a component;
 first and second viewing means cooperating with said positioning member, said second viewing means being mounted on said positioning member;
 means cooperating with said positioning member and said first viewing means for moving said positioning member to position said component over said first viewing means
 means cooperating with said positioning member and said second viewing means for moving said positioning member to position said second viewing means over a target position on a circuit board;
 means cooperating with said first viewing means and said pick up means for determining the orientation of said component relative to said first viewing means;
 means cooperating with said second viewing means and said positioning member for determining the orientation of said target relative to said second viewing means; and
 means cooperating with said first and second viewing means and said positioning member for moving said positioning member to position said component over said target with said component correctly oriented relative to said target.

17. Apparatus as claimed in claim 16, including means cooperating with said first and second viewing means for calibrating said first viewing means ans said second viewing means.

18. Apparatus as claimed in claim 16, including means cooperating with said first and second viewing means for calibrating the position and orientation of said second viewing means relative to said pick-up means.

19. Apparatus as claimed in claim 16, including means cooperating with said second viewing means and said positioning member for calibrating the position and orientation of said second viewing means relative to a datum position coincident with said target position on said board.

20. Apparatus as claimed in claim 16, including means, cooperating with said positioning means, for moving said component over said first viewing means in a predetermined pattern whereby the presence and position of each contact on said component is determined.

* * * * *